United States Patent [19]

Werner

[11] Patent Number: 4,835,596
[45] Date of Patent: May 30, 1989

[54] TRANSISTOR WITH A HIGH COLLECTOR-EMITTER BREAKTHROUGH VOLTAGE

[75] Inventor: Wolfgang Werner, Munich, Fed. Rep. of Germany

[73] Assignee: Siemens Aktiengesellschaft, Berlin and Munich, Fed. Rep. of Germany

[21] Appl. No.: 590,556

[22] Filed: Mar. 19, 1984

Related U.S. Application Data

[63] Continuation of Ser. No. 283,377, Jul. 15, 1981, abandoned.

[30] Foreign Application Priority Data

Aug. 4, 1980 [DE] Fed. Rep. of Germany ....... 3029553

[51] Int. Cl.⁴ .................. H01L 27/10; H01L 29/70; H01L 29/76
[52] U.S. Cl. .................................. 357/43; 357/13; 357/22; 357/46; 357/48
[58] Field of Search ............... 357/13, 22, 43, 48, 357/46

[56] References Cited

U.S. PATENT DOCUMENTS

| | | | |
|---|---|---|---|
| 3,404,295 | 10/1968 | Warner, Jr. | 357/34 |
| 3,441,815 | 4/1969 | Pollock et al. | 357/48 |
| 3,564,356 | 2/1971 | Wilson | 357/34 |
| 4,003,072 | 1/1977 | Matsushita et al. | 357/20 |
| 4,292,642 | 9/1981 | Appels et al. | 357/13 |
| 4,337,474 | 6/1982 | Yukimoto | 357/13 |

FOREIGN PATENT DOCUMENTS

| | | | |
|---|---|---|---|
| 52-44574 | 4/1977 | Japan | 357/22 |
| 53-67368 | 6/1978 | Japan | 357/43 |

OTHER PUBLICATIONS

Werner et al., 1981, IEEE ISSCC, DIG. Tech. Papers, pp. 40-41 (Feb. 1981).
Wyland, IBM Tech. Discl. Bulletin, vol. 13, No. 1, Jun. 1970, pp. 204-205.
Hamilton & Howard, Basic Integrated Circuit Engineering (McGraw-Hill, NY, 1975), pp, 4-10.
Bernard Lewis Grung, "Investigation . . . Lock-Layer Transistor", PhD Thesis, U. of Minn., pp. 14, 15, 86-88 (Dissert. Absts. Internat., Sep. 77, pp. 1331B-1332B).
Warner, Jr. et al., Solid State Electronics, Apr. 1975, pp. 323-325, "Bipolar Lock-Layer Transistor".

Primary Examiner—William D. Larkins
Attorney, Agent, or Firm—Herbert L. Lerner; Laurence A. Greenberg

[57] ABSTRACT

Transistor arrangement with a high collector-emitter breakthrough voltage having a heavily doped emitter zone in a more weakly doped base zone includes an even more weakly doped collector zone having a collector contact diffusion region and a buried layer region, the base zone being embedded in the collector zone, the collector zone being formed of a weakly doped epitaxial layer on a substrate having a type of conduction opposite that of the epitaxial layer, the buried layer region at least partially underlying the base zone.

2 Claims, 5 Drawing Sheets

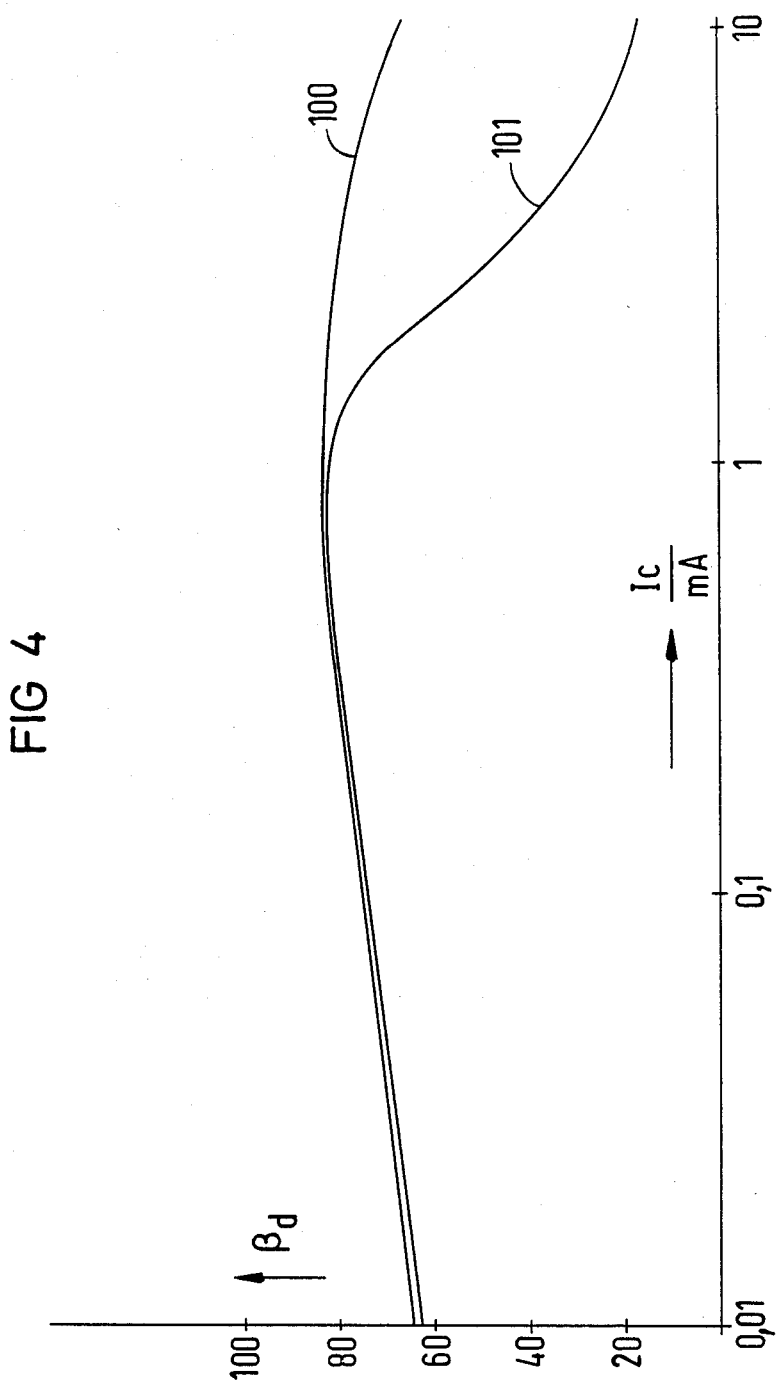

TRANSISTOR WITH A HIGH COLLECTOR-EMITTER BREAKTHROUGH VOLTAGE

This application is a continuation, of application Ser. No. 283,377, filed July 15, 1981 now abandoned.

The invention relates to a transistor arrangement with a high collector-emitter breakthrough voltage and, more particularly, with such a transistor arrangement having a heavily doped emitter zone in a more weakly doped base zone, the base zone being embedded in an even more weakly doped collector zone with a collector contact diffusion region and a buried layer region.

I$^2$L technology is highly suitable, because of the compatibility thereof with bipolar technology, for the integration of analog and digital functions within a circuit. Important electrical parameters, such as fan-out and switching speed, for example, improve with decreasing thickness of the epitaxial layer provided on the substrate of the circuit. Smaller thicknesses of the epitaxial layer result, however also in lower collector-base and collector-emitter breakthrough voltages, respectively, which is a substantial disadvantage for realizing many analog functions. For a thickness of 3 μm of the epitaxial layer, there results, for example, a collector-base breakthrough voltage of 30 volts and a collector-emitter breakthrough voltage of 5 to 10 volts.

Higher values for the collector-emitter breakthrough voltage are usually achieved by connecting NPN-transistors in series, which requires considerable area, or by using the so-called Blauschild-diode (see R. A. Blauschild, "High-Voltage Analog Performance with Low-Voltage Digital Devices", IEEE Journal of Solid State Circuits, Volume SC-13, No. 6, December 1978).

Another possibility of attaining high collector-emitter breakthrough voltages exists in the use of processes with very high epitaxial thicknesses (8 to 15 μm) and very weak dopings (1 to 6·10$^{15}$ cm$^{-3}$) of the epitaxial layer. However, fast digital circuits (ECL, ITL, I$^2$L, ISL) cannot be realized with these processes. Moreover, the lateral dimensions of the components are naturally considerably larger (packing density) than with the process used here with an epitaxial thickness of only 2 to 3 μm (note Leif Halbo and Trond A. Hansen, "I$^2$L and high voltage analog circuits on the same chip: A comparison between various combination processes", IEEE Journal of Solid-State-Circuits, SC-14, No. 4, Pages 666 to 671, (1979)).

It is therefore an object of the invention to provide a transistor arrangement of the type mentioned at the introduction hereto which is marked by a high collector-emitter breakthrough voltage or collector-base breakthrough voltage and which requires considerably less space for a given collector current than do heretofore known transistor arrangements of this general type, and which further affords the realization or development of very fast digital circuits (ELC, LSTTL, HSTTL, I$^2$L, ISL), which has not previously been possible with the heretofore known techniques.

With the foregoing and other objects in view, there is provided, in accordance with the invention, a transistor arrangement with a high collector-emitter breakthrough voltage having a heavily doped emitter zone in a more weakly doped base zone, comprising an even more weakly doped collector zone having a collector contact diffusion region and a buried layer region, the base zone being embedded in the collector zone, the collector zone being formed of a weakly doped epitaxial layer on a type of conduction opposite that of the epitaxial layer, the buried layer region at least partially underlying the base zone.

In accordance with another feature of the invention, the substrate is weakly doped.

In the transistor arrangement according to the invention, the rim of the base extends beyond the rim of the buried layer (note FIG. 1). A injection field-effect transistor of the depletion type is thereby produced, across which the greater part of the collector voltage drops. In this regard, the base zone of the NPN-transistor is identical with the gate electrode of the junction field-effect transistor, while the collector region below the base zone, however, beyond the buried layer, corresponds to the channel of the junction field-effect transistor.

In this transistor arrangement, according to the invention, the effect or operation of the substrate PNP-transistor, indeed, leads to a sharp drop in the current gain measured at the external terminals, as soon as the inner NPN-transistor (note terminals C*, B, E in FIG. 2) becomes saturated.

The cause of the saturation of the transistor structure with a "diminished" buried layer which occurs even for small currents, follows from the circumstance that, with increasing collector current, the effective control voltage i.e. the potential difference between C* and B, of the junction field-effect transistor becomes smaller or, at the beginning of the saturation, attains a value of about +0.7 V., respectively. The value of the collector current $I_{CS}$, above which saturation occurs, is determined for the given technological parameters (thickness of the epitaxial layer about 3 μm, base penetration depth approximately 0.8 μm, doping of the epitaxial layer 7·10$^{15}$ atoms/cm$^3$) by the junction field-effect transistor. The collector current $I_{CS}$ can be increased only by increasing the width-to-length ratio of the channel (note also A. S. Grove, "Physics and Technology of Semiconductor Devices," Wiley, New York 1967).

In accordance with an alternate feature of the invention, the buried layer region is heavily doped and is of the same conduction type as that of the collector zone, the heavily doped buried layer region being disposed between the weakly doped substrate and the collector zone, and a junction field-effect transistor located between the base zone and the collector contact diffusion region is included, the junction field-effect transistor having a width-to-length ratio in accordance with the current to be processed. This is thus a series circuit including a bipolar transistor and a junction field-effect transistor.

In accordance with a concomitant feature of the invention, the collector deep diffusion region surrounds the base zone at given spacing therefrom.

In this structure, the control electrode is at the substrate potential and the source electrode of the junction field-effect transistor is identical with the collector of an NPN-transistor with a buried layer. Through this separation of the NPN-transistor and the junction field-effect transistor, it is possible to establish the width-to-length ratio of the junction field-effect transistor in accordance with the desired current. Due to the elimination of the parasitic substrate PNP-transistor, only negligibly small substrate currents yet flow.

For both structures, it is important that the width-to-length ratio of the channel of the junction field-effect transistor necessary for a required current, be dependent upon the selected technology parameters, namely, thickness of the epitaxial layer, doping of the epitaxial layer and base penetration depth. For the operation of the transistor structures according to the invention, it is furthermore important that the pinch voltage i.e. the limit between the take-off or starting region and the saturation region of the junction field-effect transistor, be smaller than the collector-emitter breakoff voltage of the inner NPN-transistor (EBC*).

The collector-emitter breakoff voltage ($U_{CEO}$) obtained with the transistor structures according to the invention is higher by a factor of 5 to 10 than that of normal i.e. conventional NPN-transistors. $U_{CEO}$ corresponds approximately to the breakoff voltage of a non-curved collector-base junction.

Other features which are considered as characteristic for the invention are set forth in the appended claims.

Although the invention is illustrated and described herein as embodied in transistor with a high collector-emitter breakthrough voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 4 is a plot diagram showing the dependence of the current gain of the collector current in a conventional transistor and in the transistor arrangement according to FIG. 1;

Figure 1:
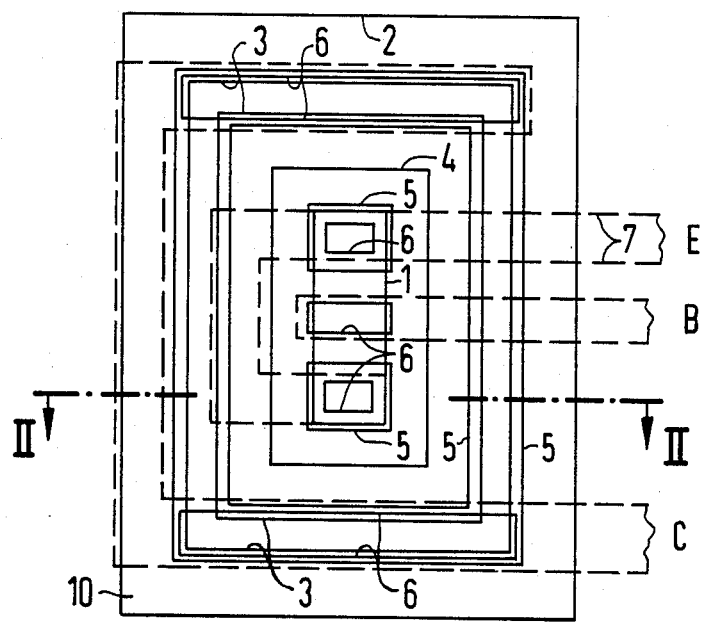
FIG. 1 is a top plan view of an embodiment of a transistor arrangement according to the invention.

Referring now to the drawing and first, particularly, to FIG. 1 thereof, there is shown a top plan view of an embodiment of the transistor arrangement according to the invention wherein a base 4 is only partially underlaid by a buried layer 1, so that a lateral junction field-effect transistor becomes effective at this location.

A semiconductor body 10 is covered on the surface thereof by an insulating layer formed preferably of silicon dioxide. Conductor runs 7 of metal, preferably of aluminum, are applied to the insulating layer. With these conductor runs 7, the various transistor zones E, B, C are connected through respective contact windows 6 formed in the insulating layer. Thus, emitter contact E is connected to the emitter zones 5 via various contact windows 6. Also, the base contact B is connected to the base zone 4 via respective contact windows 6. The collector contact C, finally is likewise connected via a respective contact window 6 to a collector deep-diffusion zone 3.

Figure 2:
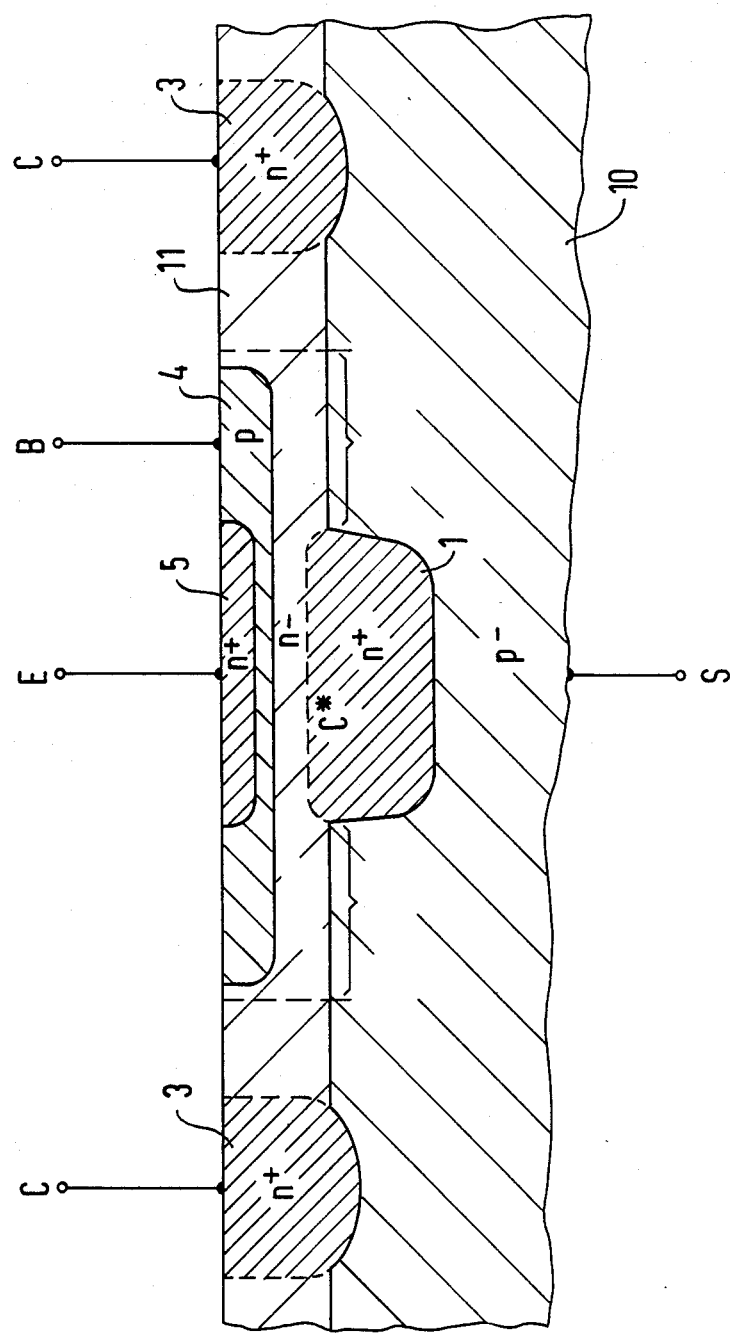
FIG. 2 is an enlarged cross-sectional view of the transistor arrangement of FIG. 1 taken along the line II—II in direction of the arrows.

FIG. 2 is a cross-sectional view of FIG. 1 taken along the line II—II. In FIG. 2, the various metal conductor runs 7 are indicated or represented diagrammatically by respective contacts C, B, E. As can be seen in FIG. 2, a heavily N+-doped emitter zone 5 is located in a P-doped base zone 4, which in turn is surrounded by a weakly n−-doped collector zone 11, the electrical contact of which is effected via the collector deep-diffusions 3, which are heavily n+-doped. The zones 3, 4, 5 and 11 are located on a preferably weakly P−-doped substrate. Between the p-doped substrate 10 and the n-doped collector zone 11 and under part of the base zone 4, there is a heavily n-doped zone 1, the so-called buried layer. The dimensions and the position of the buried layer 1 and the base zone 4 are so chosen that a lateral junction field-effect transistor according to FIG. 2 is produced. The base zone 4 and the substrate 10 form the gate electrode of the junction field-effect transistor. The channel region is also indicated in FIG. 2.

Figure 3:
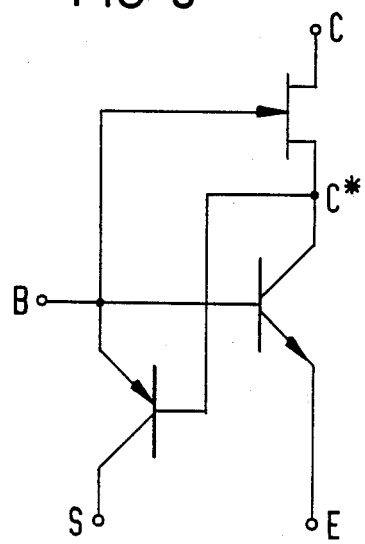
FIG. 3 is an equivalent circuit diagram of the transistor arrangement of FIG. 1.

FIG. 3 shows an equivalent circuit diagram for the transistor arrangement according to FIGS. 1 and 2. Mutually corresponding components are provided with the same reference characters in the figures. As can be seen from FIG. 3, the junction field-effect transistor is located between the collector terminal C and the inner collector C* and the zone 1, respectively. The gate electrode of the junction field-effect transistor is identical with the base contact B which, in turn, is also connected to the emitter of a substrate PNP-transistor, the base of which is identical with the channel region of the junction field-effect transistor and the collector of which is connected to the substrate contact S.

With such a transistor structure and the technology parameters further mentioned herein-above, a collector-emitter breakthrough voltage $U_{CEO}$ of between 40 and 60 V may be attained. In this regard, $U_{CEO}=U_{CBO}$.

In FIG. 4, the current gain is plotted as a function of the collector current for a conventional transistor with buried layer and for the transistor shown in FIG. 1. As can be seen from FIG. 4, the current gain $\beta_d$ of the transistor according to FIG. 1 (curve 101) declines sooner for large currents than does the current gain (curve 100) of a standard transistor with a normally formed buried layer. The reason for this is that the inner transistor E, B, C* becomes saturated prematurely due to the voltage drop at the junction field-effect transistor, which results in activation of the substrate PNP-transistor.

Figure 5:
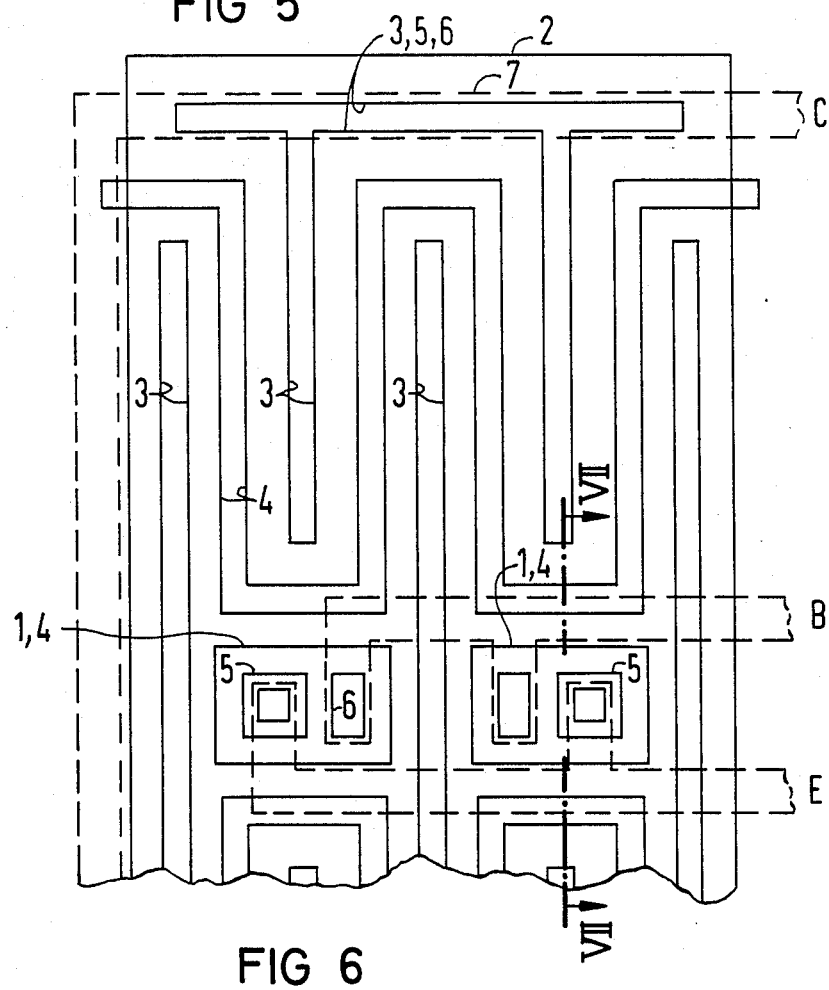
FIG. 5 is a fragmentary top plan view of another embodiment of the transistor arrangement according to the invention.

FIG. 5 shows a further embodiment of the transistor arrangement according to the invention in a top plan view, in contrast with FIG. 1, however, the base 4 being completely underlaid with a buried layer 1. Moreover, mutually corresponding parts in FIG. 5 and FIG. 1 are provided with the same reference symbols.

With the transistor arrangement shown in FIG. 5, a considerably greater current can be drawn for the same emitter area of the transistor, because the possibility exists there of adapting or accommodating the width-to-length ratio of the junction field-effect transistors to the current deliverable by the NPN-transistor (E, B, C*). With this structure of FIG. 5, the collector-emitter breakthrough voltage $U_{CEO}$ lies likewise within the range 40 to 60 V.

As is apparent in FIG. 5, the embodiment illustrated therein uses so-called collector-deep fingers in order thus to form a junction field-effect transistor with low path resistances, the channel width-length ratio of which is designed in accordance with the current to be processed.

Figure 6:
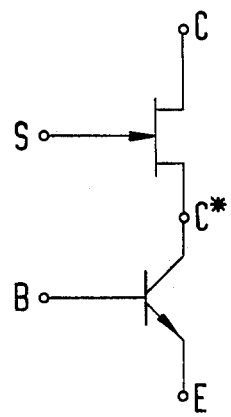
FIG. 6 is an equivalent circuit diagram of the transistor arrangement of FIG. 5.

FIG. 6 shows the quivalent circuit diagram for the embodiment of FIG. 5. The junction field-effect transistor and the bipolar transistor thus shown therein are connected in series with one another and are connected to one another via the point C*.

Figure 7:
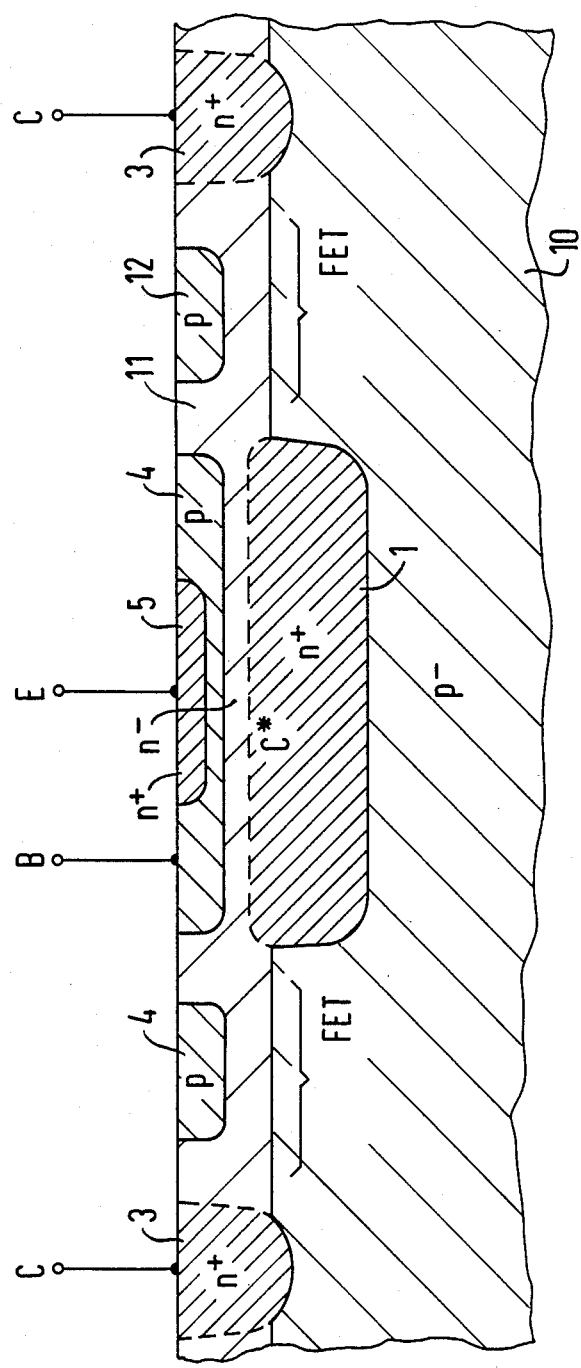
FIG. 7 is an enlarged cross-sectional view of FIG. 5 taken along the line VII—VII in direction of the arrows.

FIG. 7 is a cross sectional view of FIG. 5 taken along the line VII—VII. The gate electrode 12 is separated from the base 4 and is connected electrically to the substrate. The parasitic substrate PNP-transistor can thereby be no longer effective, which prevents a corresponding substrate current.

There are claimed:

1. Transistor arrangement with a high collector-emitter breakthrough voltage having a heavily doped emitter zone in a more weakly doped base zone, comprising an even more weakly doped collector zone having a collector contact diffusion region and a buried layer region, the base zone being embedded in said collector zone, said collector zone being formed of a weakly doped epitaxial layer on a weakly doped substrate having a type of conduction opposite that of said epitaxial layer, the buried layer region at least partially underlying the base zone, the buried layer region being heavily doped and being of the same conduction type as that of the collector zone, the heavily doped buried layer region being disposed between said weakly doped substrate and the collector zone, and a junction field-effect transistor located between the base zone and the collector contact diffusion region, said junction field-effect transistor having a width-to-length ratio in accordance with the current to be processed, the collector contact diffusion region surrounding the base zone at a given spacing therefrom, said base zone projecting laterally beyond said buried layer region, said junction field-effect transistor having a channel formed of a region of said collector zone lying between said base zone and said substrate and also between an edge of said base zone and an edge of said buried layer region, said junction field-effect transistor having a source and a drain, respectively formed of the buried layer and the collector contact diffusion zone, respectively, and a region of the collector zone directly bordering the respective buried layer and collector; said emitter zone, said base zone and said collector zone forming a bipolar transistor, and said junction field-effect transistor having a pinch voltage smaller than the collector-emitter breakthrough voltage of said bipolar transistor.

2. Transistor arrangement according to claim 1, wherein the buried layer is of such width that the base zone is only partly underlaid by the buried layer.

* * * * *